United States Patent
Sangam et al.

(10) Patent No.: US 8,187,381 B2
(45) Date of Patent: May 29, 2012

(54) PROCESS GAS DELIVERY FOR SEMICONDUCTOR PROCESS CHAMBER

(75) Inventors: Kedarnath Sangam, Sunnyvale, CA (US); Anh N. Nguyen, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 944 days.

(21) Appl. No.: 12/197,029

(22) Filed: Aug. 22, 2008

(65) Prior Publication Data

US 2010/0048032 A1    Feb. 25, 2010

(51) Int. Cl.
*C30B 35/00* (2006.01)
(52) U.S. Cl. .......... 117/200; 118/715; 118/719
(58) Field of Classification Search .......... 117/200–224; 118/715, 719
See application file for complete search history.

(56) References Cited

U.S. PATENT DOCUMENTS

| | | | |
|---|---|---|---|
| 6,773,507 B2 * | 8/2004 | Jallepally et al. | 117/89 |
| 6,916,398 B2 * | 7/2005 | Chen et al. | 156/345.33 |
| 7,794,544 B2 * | 9/2010 | Nguyen et al. | 118/715 |
| 2004/0005731 A1 | 1/2004 | Jurgensen et al. | |
| 2005/0252449 A1 * | 11/2005 | Nguyen et al. | 118/715 |
| 2005/0271813 A1 * | 12/2005 | Kher et al. | 427/248.1 |
| 2008/0041307 A1 | 2/2008 | Nguyen et al. | |

FOREIGN PATENT DOCUMENTS

| JP | 63-293165 A | 11/1988 |
|---|---|---|
| JP | 02-213476 A | 8/1990 |
| JP | 08-250426 A | 9/1996 |

OTHER PUBLICATIONS

International Search Report and Written Opinion mailed Mar. 31, 2010 for PCT Application No. PCT/US2009/054423.

* cited by examiner

*Primary Examiner* — Michael Kornakov
*Assistant Examiner* — Kenneth A Bratland, Jr.
(74) *Attorney, Agent, or Firm* — Moser Taboada; Alan Taboada

(57) ABSTRACT

Methods and apparatus for a gas delivery assembly are provided herein. In some embodiments, the gas delivery assembly includes a gas inlet funnel having a first volume and one or more gas conduits; each gas conduit having an inlet and an outlet for facilitating the flow of a gas therethrough and into the first volume, wherein each gas conduit has a second volume less than the first volume, and wherein each gas conduit has a cross-section that increases from a first cross-section proximate the inlet to a second cross-section proximate the outlet, wherein the second cross-section is non-circular. In some embodiments, each conduit has a longitudinal axis that intersects a central axis of the gas inlet funnel.

20 Claims, 3 Drawing Sheets

PROCESS GAS DELIVERY FOR SEMICONDUCTOR PROCESS CHAMBER

BACKGROUND OF THE INVENTION

1. Field of the Invention

Embodiments of the present invention generally relate to semiconductor processing equipment, and more specifically a gas delivery assembly for introducing a process gas into a semiconductor process chamber.

2. Description of the Related Art

In some semiconductor process chambers, multiple process gases can be delivered to the process chamber through a common gas inlet, for example, a gas injection funnel disposed in the ceiling of a process chamber. Such semiconductor process chambers may include those used for chemical vapor deposition (CVD) or atomic layer deposition (ALD) wherein the process gases may be utilized to at least partially deposit a layer on a substrate.

The volume of a common gas inlet can be substantially greater than the volume of a gas conduit which supplies a process gas to the inlet. Consequently, the process gas rapidly expands when entering the inlet. The rapid expansion of the process gas can result in cooling of the process gas—an effect known as Joule-Thompson Cooling. Process gases having low vapor pressures, for example hafnium tetrachloride ($HfCl_4$), will condense upon cooling, thus forming particles that may contaminate the inlet or result in concentration variation in the process gas.

Further, tangential alignment of a gas conduit relative to a central axis of the common gas inlet can result in a circulating gas vortex in the gas inlet and over the substrate. The vortex can cause the process gas, for example, comprising a carrier gas and a reactant vapor, to become separated resulting in concentration variations in the process gas.

Accordingly, there is a need in the art for a gas delivery assembly that prevents rapid cooling and vortex formation.

SUMMARY OF THE INVENTION

Methods and apparatus for a gas delivery assembly are provided herein. In some embodiments, the gas delivery assembly includes a gas inlet funnel having a first volume and one or more gas conduits; each gas conduit having an inlet and an outlet for facilitating the flow of a gas therethrough and into the first volume, wherein each gas conduit has a second volume less than the first volume, and wherein each gas conduit has a cross-section that increases from a first cross-section proximate the inlet to a second cross-section proximate the outlet, wherein the second cross-section is non-circular.

In some embodiments, an apparatus for processing a substrate includes a process chamber having an inner volume and a gas delivery assembly coupled to the process chamber for introducing a process gas into the inner volume. The gas delivery assembly may be the same as discussed above.

In some embodiments, a method for processing a substrate includes flowing a process gas through one or more first volumes into a second volume, wherein each first volume has a cross-section that increases from a first cross-section proximate to a second cross-section along a longitudinal axis in the direction of flow, wherein the second cross-section is non-circular, and wherein the second volume is greater than each first volume; and delivering the process gas to the substrate via the second volume.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Methods and apparatus for a gas delivery assembly are provided herein. In some embodiments, the gas delivery assembly includes a gas inlet funnel having a first volume and one or more gas conduits; each gas conduit having an inlet and an outlet for facilitating the flow of a gas therethrough and into the first volume, wherein each gas conduit has a second volume less than the first volume, and wherein each gas conduit has a cross-section that increases from a first cross-section proximate the inlet to a second cross-section proximate the outlet, wherein the second cross-section is non-circular. The gas delivery assembly may be coupled to a process chamber for facilitating the introduction of process gases thereto. Process gases may include, for example, a hafnium precursor such as hafnium tetrachloride ($HfCl_4$) or other low vapor pressure reactant gases flowed in combination with a carrier gas that may benefit from a reduction in Joule-Thompson cooling and/or the gas separation caused by vortex formation provided by embodiments of the present invention, and discussed below.

"Atomic Layer Deposition" (ALD) or "cyclical deposition" as used herein refers to the sequential introduction of two or more reactive compounds to deposit a layer of material on a substrate surface. The two, three or more reactive compounds may alternatively be introduced into a reaction zone of the processing chamber. Usually, each reactive compound is separated by a time delay to allow each compound to adhere and/or react on the substrate surface. In one aspect, a first precursor or compound A, such as a hafnium precursor, is pulsed into the reaction zone followed by a first time delay. Next, a second precursor or compound B, such as an oxidizing gas, is pulsed into the reaction zone followed by a second delay. The oxidizing gas may include several oxidizing agent, such as in-situ water and oxygen. During each time delay a purge gas, such as nitrogen, is introduced into the processing chamber to purge the reaction zone or otherwise remove any residual reactive compound or by-products from the reaction zone. Alternatively, the purge gas may flow continuously throughout the deposition process so that only the purge gas flows during the time delay between pulses of reactive compounds. The reactive compounds are alternatively pulsed until a desired film or film thickness is formed on the substrate surface. In either scenario, the ALD process of pulsing compound "A", purge gas, pulsing compound B or purge gas is a cycle. A cycle can start with either compound A or compound B and continue the respective order of the cycle until achieving a film with the desired thickness.

Figure 1:
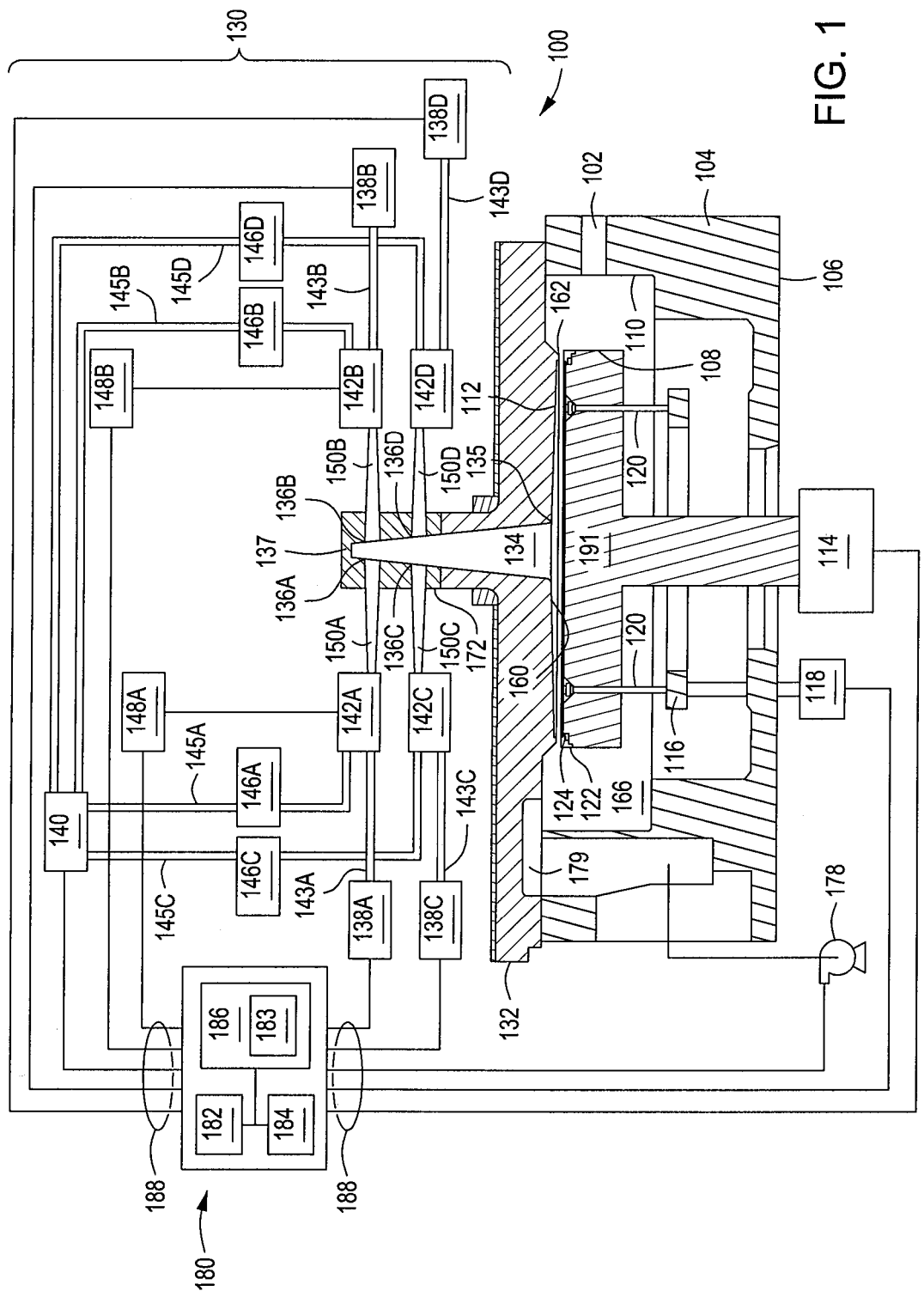
FIG. 1 is a schematic cross-sectional view of a process chamber in accordance with some embodiments of the present invention.

FIG. 1 is a schematic cross-sectional view of a process chamber 100 in accordance with some embodiments of the present invention. The process chamber 100 includes a gas delivery assembly 130 adapted for cyclic deposition, such as atomic layer deposition (ALD) or rapid chemical vapor deposition (rapid CVD). The terms ALD and rapid CVD as used herein refer to the sequential introduction of reactants to deposit a thin layer over a substrate. The sequential introduction of reactants may be repeated to deposit a plurality of thin layers to form a conformal layer of a desired thickness.

The process chamber 100 comprises a chamber body 104 having sidewalls 110 and a bottom 106. A slit valve 102 in the process chamber 100 provides access for a robot (not shown) to deliver and retrieve a substrate 112 within the process chamber 100. In some embodiments of the present invention, the substrate 112 can be a semiconductor wafer with a diameter of 200 mm or 300 mm or a glass substrate. The process chamber 100 can include any suitable chamber configured for ALD or rapid CVD that may benefit from the inventive apparatus and methods disclosed herein. Some exemplary process chambers are described in commonly assigned United States Patent Application Publication No. 2005-0271813, filed on May 12, 2005, entitled "Apparatuses and Methods for Atomic Layer Deposition of Hafnium-Containing High-K Dielectric Materials," and United States Patent Application Publication No. 2003-0079686, filed on Dec. 21, 2001, entitled "Gas Delivery Apparatus and Method for Atomic Layer Deposition", which are both incorporated herein in their entirety by references. Two exemplary chambers suitable for performing at least some of the inventive techniques may include GEMINI ALD or CVD chambers available from Applied Materials, Inc.

A substrate support 108 supports the substrate 112 on a substrate receiving surface 191 in the process chamber 100. The substrate support (or pedestal) 108 is mounted to a lift motor 114 to raise and lower the substrate support 108 and the substrate 112 disposed thereon. A lift plate 116 connected to a lift motor 118 is mounted in the process chamber 100 and raises and lowers pins 120 movably disposed through the substrate support 108. The pins 120 raise and lower the substrate 112 over the surface of the substrate support 108. In some embodiment of the present invention, the substrate support 108 may include a vacuum chuck, an electrostatic chuck, or a clamp ring for securing the substrate 112 to the substrate support 108 during processing.

The substrate support 108 may be heated to increase the temperature of the substrate 112 disposed thereon. For example, the substrate support 108 may be heated using an embedded heating element, such as a resistive heater, or may be heated using radiant heat, such as heating lamps disposed above the substrate support 108. A purge ring 122 may be disposed on the substrate support 108 to define a purge channel 124 which provides a purge gas to a peripheral portion of the substrate 112 to prevent deposition thereon.

The gas delivery assembly 130 is disposed at an upper portion of the chamber body 104 to provide a gas, such as a process gas and/or a purge gas, to the process chamber 100. For example, and in some embodiments, a process gas may include a hafnium precursor or other suitable reactant gases having a low vapor pressure, and a carrier gas. A vacuum system 178 is in communication with a pumping channel 179 to evacuate any desired gases from the process chamber 100 and to help in maintaining a desired pressure or a desired pressure range inside a pumping zone 166 of the process chamber 100.

The gas delivery assembly 130 may further comprise a chamber lid 132. The chamber lid 132 can include a gas inlet funnel 134 extending from a central portion of the chamber lid 132 and a bottom surface 160 extending from the gas inlet funnel 134 to a peripheral portion of the chamber lid 132. The bottom surface 160 is sized and shaped to substantially cover the substrate 112 disposed on the substrate support 108. The chamber lid 132 may have a choke 162 at a peripheral portion of the chamber lid 132 adjacent the periphery of the substrate 112. The cap portion 172 includes a portion of the gas inlet funnel 134 and the gas inlets 136A, 136B, 136C, 136D. The gas inlet funnel 134 has the gas inlets 136A, 136B, 136C, 136D to provide gas flows from two similar valves 142A, 142B, 142C, 142D. The gas flows from the valves 142A, 142B, 142C, 142D may be provided together and/or separately.

Embodiments of the gas inlet assembly that may facilitate reduced Joule-Thompson Cooling and gas separation caused by vortex formation are discussed below with respect to FIGS. 2A-B and 3A-B. Generally, such embodiments relate to the cross-sectional shape of one or more gas conduits 150 and their orientation with respect to the gas inlet funnel 134

Figure 2A:
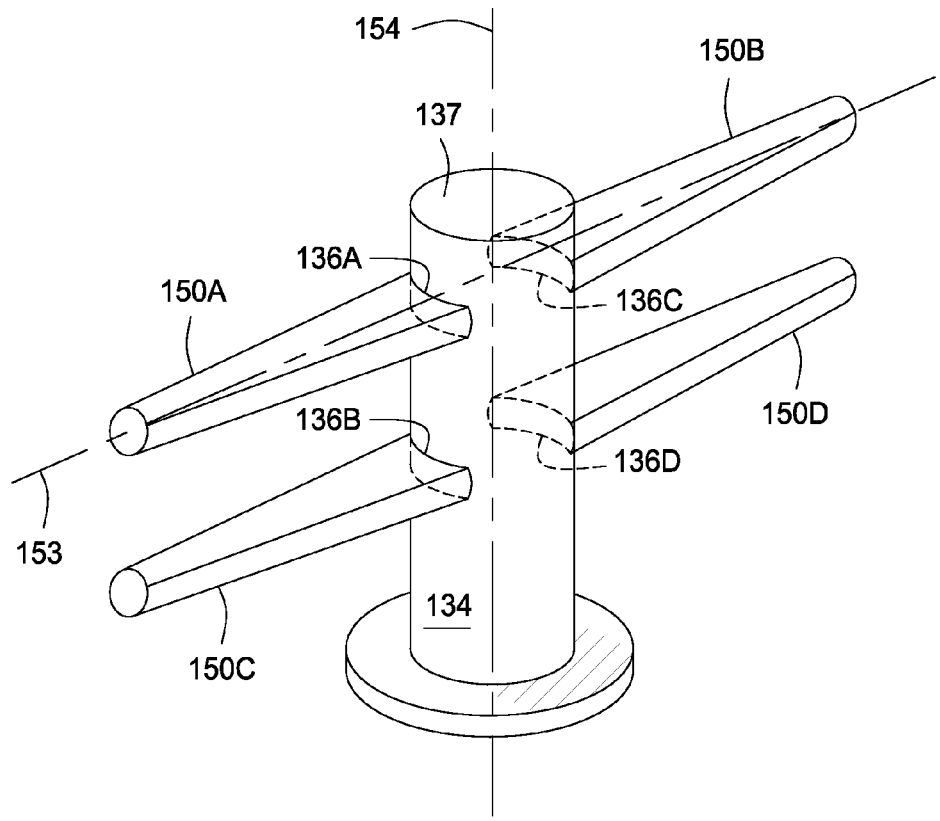
FIGS. 2A-B are schematic side views of a gas delivery assembly and gas conduit in accordance with some embodiments of the present invention.
Figure 2B:
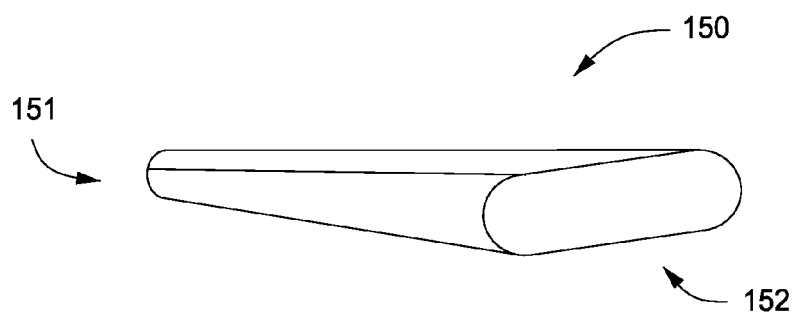
Figure 3A:
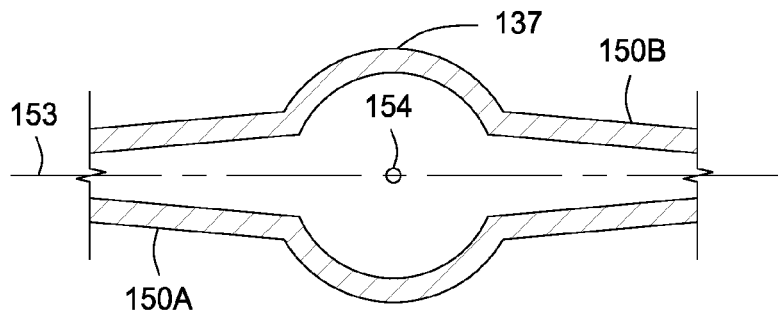
FIGS. 3A-B are schematic top views of a gas delivery assembly in accordance with some embodiments of the present invention.
Figure 3B:
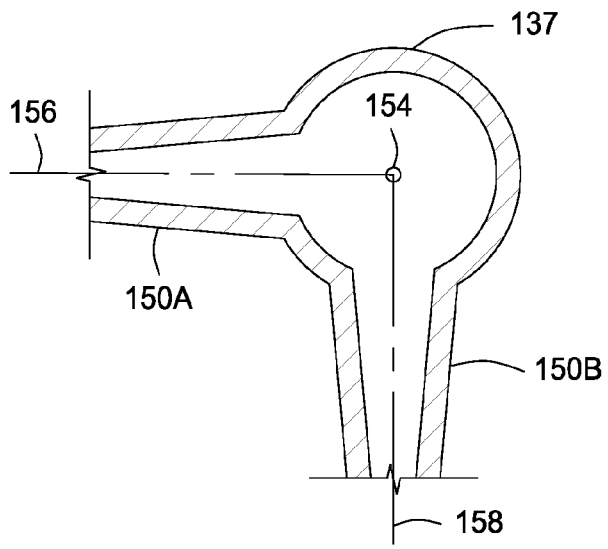

FIGS. 2A-B depict a three dimensional view of a portion of the gas delivery assembly 130 including the gas inlet funnel 134 and one or more gas conduits 150 in accordance with some embodiments of the present invention. Referring to FIG. 1, the gas conduits 150A, 150B, 150C, and 150D are disposed between the gas inlets 136A, 136B, 136C, 136D and the valves 142A, 142B, 142C, 142D The gas inlet funnel 134 depicted in FIG. 2A may be generally cylindrical in shape and having a first volume and a central axis disposed therethrough. In some embodiments, such as depicted in FIG. 1, the gas inlet funnel 134 can have a cross-section expanding along at least a portion of the central axis and in the direction of gas flow. The gas inlet funnel 134 may comprise one or more tapered inner surfaces (not shown), such as a tapered straight surface, a concave surface, a convex surface, or combinations thereof or may comprise sections of one or more tapered inner surfaces (i.e., a portion tapered and a portion non-tapered).

The gas conduits 150A, 150B, 150C, and 150D are coupled to the gas inlet funnel 134 at the gas inlets 136A, 136B, 136C, and 136D, respectively. Each gas conduit as illustrated in FIG. 2B has an inlet 151 and an outlet 152 for facilitating the flow of a process gas therethrough along a longitudinal axis and into the first volume define by the gas inlet funnel 134 via each gas inlet 136. Each gas conduit 150 defines a second volume that is less than the first volume of the gas inlet funnel 134. The difference between the first and second volumes may be such that, in the absence of the present invention, a process gas flowing from the second volume of a gas conduit 150 into the first volume of the gas inlet funnel may experience a Joule-Thompson Cooling effect which can result in the formation of fine particles from the process gas and concentration variations in the process gas delivered to the substrate.

To reduce Joule-Thompson Cooling, each gas conduit 150 may be shaped for having a cross-section that increases from a first cross-section proximate the inlet 151 to a non-circular, second cross-section proximate the outlet 152. The increasing cross-section along the direction of gas flow between the inlet 151 and the outlet 152 expands the volume gradually in the gas conduit, thereby maintaining chemical equilibrium in, for example, a low vapor pressure reactant gas. Thus, the gradual expansion of the cross-section of each gas conduit 150 can reduce a rapid temperature drop in the reactant gas. In some embodiments, and by way of non-limiting example, the first cross-section proximate the inlet 151 can be circular. However, any suitable shape for the first cross-section can be selected.

The second cross-section proximate the outlet 152 of each gas conduit 150 may be non-circular. As depicted in FIG. 2B, the second cross-section may be generally rectangular; however, other suitable shapes may be contemplated. In some embodiments, the ratio of the area of the second cross-section to the area of the first cross-section is about 3:1 or greater. Those skilled in the art may utilize other ratios such as to manage the temperature drop in the process gas caused by Joule-Thompson Cooling along an expanding cross-section of each gas conduit between the inlet 151 and the outlet 152.

In some embodiments, a non-circular shape is chosen for the second cross-section such that the shape maximized the surface area of gas conduit contacted by a process gas flowing therethrough. Such non-circular shapes which maximize surface area can be chosen, for example, and in some embodiments, where external heaters are coupled to the outer surface of each gas conduit. The external heaters may provide heat as a further means of reducing the Joule-Thompson Cooling caused by an expanding cross-section of each gas conduit between the inlet 151 and the outlet 152. The maximized surface area of the second-cross section contacting the heater can facilitate maximum heat transfer along second-cross section.

Returning to FIG. 2A, and in some embodiments, each gas conduit 150 has a longitudinal axis 153 that intersects the central axis 154 of the gas inlet funnel 134. Such an orientation may provide laminar flow of the process gas in the gas inlet funnel 134, thus reducing vortex formation. Further, laminar flow in the gas inlet funnel 134 may improve purging of the inner surface of the gas inlet funnel 134 and other surfaces of the chamber lid 132.

Further, and by way of non-limiting example, each gas conduit 150 may have a longitudinal axis 153 that is perpendicular to the central axis of the gas inlet funnel 134, such as depicted in FIG. 2A for gas conduits 150A, 150B, 150C, and 150D. However, one or more gas conduits 150 may be angled with respect to the central axis of the gas inlet funnel 134 as necessary.

In some embodiments, at least two gas conduits may have longitudinal axes 153 that are diametrically opposed. For example, and depicted in FIG. 2A, gas conduits 150A, 150B and gas conduits 150C, 150D have longitudinal axes 153 diametrically opposed. The diametrically opposed longitudinal axes intersect the central axis of the gas inlet funnel 134 as illustrated in top view in FIG. 3A.

Other configurations of the gas conduits 150 are possible. In some embodiments, and depicted in top view in FIG. 3B, at least two gas conduits, such as gas conduits 150A, 150B, may have perpendicular longitudinal axes 156, 158 intersecting the central axis 154 of the gas inlet funnel 134. Those skilled in the art may utilize one or more orientations of the gas conduits, 150A, 150B, 150C, 150D along the gas inlet funnel 134 as discussed above.

Returning to FIG. 1, and in some embodiments, the valves 142A, 142B, 142C, and 142D are coupled to separate reactant gas sources but are preferably coupled to the same purge gas source. For example, the valve 142A is coupled to a reactant gas source 138A and valve 142B is coupled to reactant gas source 138B, and both valves 142A, 142B are coupled to the purge gas source 140. Each valve 142A, 142B, 142C, 142D includes a delivery line 143A, 143B, 143C, and 143D. The delivery line 143A, 143B, 143C, 143D is in communication with the reactant gas source 138A, 138B, 138C, 138D and is in communication with the gas inlet 136A, 136B, 136C, 136D of the gas inlet funnel 134 through the gas conduits 150A, 150B, 150C, 150D. In some embodiments, additional reactant gas sources, delivery lines, gas inlets and valves may be added to the gas delivery assembly 130. The purge lines, such as 145A, 145B, 145C, and 145D, are in communication with the purge gas source 140, and the flows of the purge lines, 145A, 145B, 145C, and 145D, are controlled by valves, 146A, 146B, 146C, and 146D, respectively. The purge lines, 145A, 145B, 145C, and 145D, intersect the delivery line 143A, 143B, 143C, 143D at the valves, 142A, 142B, 142C, and 142D. If a carrier gas is used to deliver reactant gases from the reactant gas source 138A, 138B, 138C, 138D, in one embodiment the same gas is used as a carrier gas and a purge gas (e.g., nitrogen used as a carrier gas and a purge gas). The valves, 142A, 142B, 142C, and 142D, comprise diaphragms. In some embodiments, the diaphragms may be biased open or closed and may be actuated closed or open, respectively. The diaphragms may be pneumatically actuated or may be electrically actuated. Examples of pneumatically actuated valves include pneumatically actuated valves available from Swagelock of Solon, Ohio. Pneumatically actuated valves may provide pulses of gases in time periods as low as about 0.020 second. Electrically actuated valves may provide pulses of gases in time periods as low as about 0.005 second. An electrically actuated valve typically requires the use of a driver coupled between the valve and the programmable logic controller, such as 148A, 148B.

Each valve 142A, 142B, 142C, 142D may be adapted to provide a combined gas flow and/or separate gas flows of the reactant gas 138A, 138B, 138C, 138D and the purge gas 140. In reference to the valve 142A, one example of a combined gas flow of the reactant gas 138A and the purge gas 140 provided by the valve 142A comprises a continuous flow of a purge gas from the purge gas source 140 through the purge line 145A and pulses of a reactant gas from the reactant gas source 138A through the delivery line 143A.

The delivery lines, 143A, 143B, 143C, and 143D of the valves, 142A, 142B, 142C, and 142D, are coupled to the gas inlets, 136A, 136B, 136C, and 136D, through the gas conduits, 150A, 150B, 150C, and 150D. The gas conduits, 150A, 150B, 150C, and 150D, may be integrated or may be separate from the valves, 142A, 142B, 142C, and 142D. In one embodiment, the valves 142A, 142B, 142C, 142D are coupled in close proximity to the gas inlet funnel 134 to reduce any unnecessary volume of the delivery line 143A, 143B, 143C, 143D and the gas conduits 150A, 150B, 150C, 150D between the valves 142A, 142B, 142C, 142D and the gas inlets 136A, 136B, 136C, 136D.

The gas inlets 136A, 136B, 136C, 136D are located adjacent to the upper portion 137 of the gas inlet funnel 134. In other embodiments, one or more gas inlets 136A, 136B, 136C, 136D may be located along the length of the gas inlet funnel 134 between the upper portion 137 and the lower portion 135.

At least one portion of the bottom surface 160 of the chamber lid 132 may be tapered from the gas inlet funnel 134 to a peripheral portion of the chamber lid 132 to help in providing an improved velocity profile of a gas flow from the gas inlet funnel 134 across the surface of the substrate 112 (i.e., from the center of the substrate 112 to the edge of the substrate 112). In some embodiments, the bottom surface 160 may comprise one or more tapered surfaces, such as a straight surface, a concave surface, a convex surface, or combinations thereof. In some embodiments, the bottom surface 160 is tapered in the shape of a funnel.

A control unit 180, such as a programmed personal computer, work station computer, or the like, may be coupled to the process chamber 100 to control processing conditions. For example, the control unit 180 may be configured to control flow of various process gases and purge gases from the gas sources 138A, 138B, 138C, 138D, 140 through the valves 142A, 142B, 142C, 142D, 146A, 146B, 146C, 146D during different stages of a substrate process sequence. Illustratively, the control unit 180 comprises a Central Processing Unit (CPU) 182, support circuitry 184, and a memory 186 containing associated control software 183. The control unit 180 may control each component of the process chamber 100 directly, as illustrated by the plurality of control lines 188 coupling the control unit 180 to each chamber component. Alternatively, the control unit 180 may be coupled to, and control, the individual control units (not shown) of each chamber system. For example, the control unit 180 may be coupled to an individual control unit (not shown) of the gas delivery assembly 130, where the individual control unit of the gas delivery assembly 130 controls each component thereof, for example, gas sources 138A-D.

Figure 4:
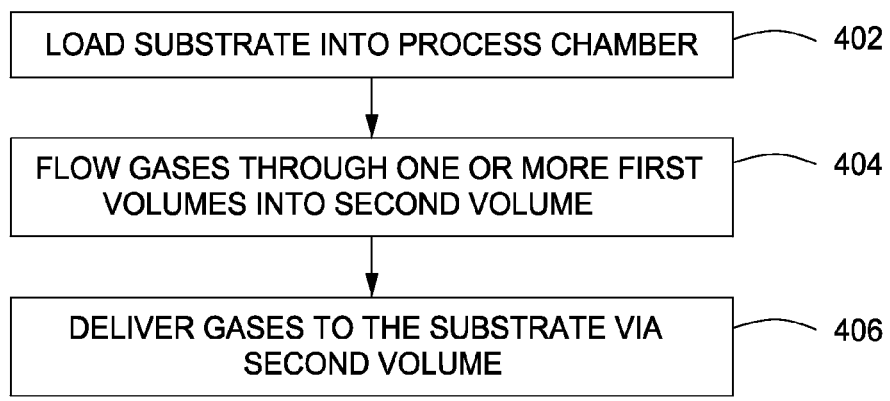
FIG. 4 is a method for processing a substrate in accordance with some embodiments of the present invention.

FIG. 4 illustrates a method for processing the substrate 112 in accordance with some embodiments of the present invention. Processing may include, for example, depositing a hafnium oxide ($HfO_x$) film atop a substrate by an ALD process. The deposition process includes providing a hafnium precursor, generally in combination with a carrier gas such as nitrogen ($N_2$), that may either be subject to Joule-Thompson cooling in a rapidly expanding volume, or separation from the carrier gas as a result of vortex formation when entering a gas inlet funnel. Thus, the embodiments of the gas conduits 150 and gas inlet funnel 134 describe above may be advantageously utilized with the method 400 to prevent such undesirable effects.

The method 400 is described with reference to the process chamber 100 depicted in FIG. 1. At step 402, the substrate 112 is loaded into a process chamber 100.

At step 404, gases are flowed through one or more first volumes (i.e., gas conduits 150) into a second volume (i.e., gas inlet funnel 134). In some embodiments, a hafnium precursor is flowed through one gas conduit 150 and an oxygen-containing precursor is flowed through another gas conduit 150. The hafnium precursor and oxygen-containing precursor may be pulsed separately, or simultaneously in an ALD process to form a hafnium oxide film on the substrate 112.

The gas inlet funnel 134 and the gas conduits 150 may be arranged in any suitable arrangement as discussed above. Minimally, and as discussed above each gas conduit 150 has a longitudinal axis that intersects the central axis of gas inlet funnel 134. This orientation may advantageously prevent vortex formation as a gas flows out a gas conduit 150 and into the gas inlet funnel 134. Further, and as discussed above, each gas conduit 150 minimally has a cross-section that increases along a longitudinal axis from a first cross-section to a second cross-section, wherein the second cross-section is non-circular. The geometry of the gas conduits may advantageous reduce Joule-Thompson Cooling and provide more surface area for heat transfer as discussed above.

In some embodiments, the temperature drops along the gas conduits 150A, 150B, 150C, and 150D as gases (e.g., hafnium precursor and carrier gas) flow through each gas conduit. The temperature drops only slightly from about 190 to about 183 degrees Celsius, in contrast to a large temperature drop of about 200 degrees Celsius to 108 degrees Celsius in a conventional design. Conventional design may be, for example, a gas conduit having a rapidly expanding cross-section. Maintaining the temperature of each gas conduit 150 above about 180 degrees Celsius helps to keep the hafnium precursor in vapor form. In some embodiments, and as discussed above, heaters may be coupled to each gas conduit 150 and utilized to further reduce the temperature drop of a process gas flowing through each gas conduit 150.

At step 406, the gases are delivered to the substrate 112 via the second volume (i.e., gas inlet funnel 134). In some embodiments, a hafnium precursor is introduced to the process chamber 100 via the gas conduit 150 and gas inlet funnel 134 at a rate from about 5 mg/m to about 200 mg/m. The hafnium precursor is usually introduced with a carrier gas, such as nitrogen, with a total flow rate in the range from about 50 sccm to about 2,000 sccm. In conventional ALD processes, the hafnium precursor is pulsed into the process chamber 100 at a duration from about 1 second to about 10 seconds, depending on the particular process and desired hafnium-containing compound. In advanced ALD processes, the hafnium precursor is pulsed into the process chamber 100 at a shorter duration from about 50 ms to about 3 seconds. In some embodiments, the hafnium precursor may be hafnium tetrachloride ($HfCl_4$). In some embodiments, the hafnium precursor may be tetrakis (diethylamine) hafnium (($Et_2N)_4Hf$ or TDEAH).

The oxygen-containing precursor is introduced to the process chamber 100 at a rate in the range from about 10 sccm to about 1,000 sccm, preferably in the range from about 30 sccm to about 200 sccm. For conventional ALD processes, the oxidizing gas is pulsed into the process chamber at a rate from about 0.1 second to about 10 seconds, depending on the particular process and desired hafnium-containing compound. In advanced ALD processes, the oxidizing gas is pulsed into the process chamber at a shorter duration from about 50 ms to about 3 seconds.

The substrate 112 is then exposed to pulse of a hafnium precursor that is introduced into the process chamber 100 for a time period in a range from about 0.1 second to about 5 seconds. Next, a pulse of an oxygen-containing precursor is introduced into the processing chamber 100. In some embodiments, the oxygen-containing precursor may include several oxidizing agents, such as in-situ water and oxygen. Suitable carrier gases or purge gases may include helium, argon, nitrogen, hydrogen, forming gas, oxygen and combinations thereof. A "pulse" as used herein is intended to refer to a quantity of a particular compound that is intermittently or non-continuously introduced into a reaction zone of the processing chamber 100.

After each deposition cycle, a hafnium-containing compound, such as hafnium oxide, having a particular thickness will be deposited on the surface of the substrate 112. In some embodiments, each deposition cycle forms a layer with a thickness in the range from about 1-10 Angstroms. Depending on specific device requirements, subsequent deposition cycles may be needed to deposit hafnium-containing compound having a desired thickness. As such, a deposition cycle can be repeated until the desired thickness for the hafnium-containing compound is achieved. Thereafter, the process is stopped, when the desired thickness is achieved.

Hafnium oxide deposited by an ALD process has the empirical chemical formula $HfO_x$. The hafnium oxide has the molecular chemical formula $HfO_2$, but by varying process conditions (e.g., timing, temperature, precursors), hafnium oxide may not be fully oxidized, such as $HfO_{1.8+}$. Preferably, hafnium oxide is deposited by the processes herein with the molecular chemical formula of about $HfO_2$ or less.

In some embodiments, the cyclical deposition process or ALD process of FIG. 1 occurs at a pressure in the range from about 1 Torr to about 100 Torr, preferably in the range from about 1 Torr to about 20 Torr, for example from about 1 Torr to about 10 Torr. In some embodiments, the temperature of the substrate 112 is usually in the range from about 70 degrees Celsius to about 1,000 degrees Celsius, preferably from about 100 degrees Celsius to about 650 degrees Celsius, more preferably from about 250 degrees Celsius to about 500 degrees Celsius.

The hafnium precursor is generally dispensed to the process chamber 100 by introducing carrier gas into a bubbler containing the hafnium precursor. Suitable bubblers, such as PROE-VAP™, are available from Advanced Technology Materials, Inc., locate in Danbury, Conn. The temperature of the bubbler is maintained at a temperature depending on the hafnium precursor within, such as from about 100 degrees Celsius to about 300 degrees Celsius. For example, the bubbler may contain $HfCl_4$ at a temperature from about 150 degrees Celsius to about 200 degrees Celsius.

In some embodiments, the oxidizing gas is produced from a water vapor generating (WVG) system that is in fluid communication to the process chamber 100 by a line. The WVG system generates ultra-high purity water vapor by means of a catalytic reaction of $O_2$ and $H_2$. The WVG system has a catalyst-lined reactor or a catalyst cartridge in which water vapor is generated by means of a chemical reaction, unlike pyrogenic generators that produce water vapor as a result of ignition. Regulating the flow of $H_2$ and $O_2$ allows the concentration to be precisely controlled at any point from 1% to 100% concentrations. The water vapor may contain water, $H_2$, $O_2$ and combinations thereof. Suitable WVG systems are commercially available, such as the WVG by Fujikin of America, Inc., located in Santa Clara, Calif. and the CSGS (Catalyst Steam Generator System) by Ultra Clean Technology, located in Menlo Park, Calif.

The pulses of a purge gas, preferably argon or nitrogen, are introduced at a rate between about 1 slm to about 20 slm, preferably at a rate between about 2 slm to about 6 slm. Each processing cycle lasts from about 0.01 seconds to about 20 seconds. For example, in some embodiments, the processing cycle is about 10 seconds, while in some other embodiment, the processing cycle is about 2 seconds. Longer processing steps lasting about 10 seconds deposit excellent hafnium-containing films, but the throughput is reduced. The specific pressures and times are obtained through experimentation.

Many precursors are within the scope of the invention. One important precursor characteristic is to have a favorable vapor pressure. Precursors at ambient temperature and pressure may be gas, liquid or solid. However, within the ALD chamber, volatilized precursors are utilized. Organometallic compounds or complexes include any chemical containing a metal and at least one organic group, such as amides, alkyls, alkoxyls, alkylamidos and anilides. Precursors may comprise organometallic, inorganic and halide compounds.

An exemplary ALD process is a hafnium oxide film grown by sequentially pulsing a hafnium precursor with in-situ steam formed from a water generator. A substrate surface is exposed to a pretreatment to form hydroxyl groups. The hafnium precursor, $HfCl_4$, is maintained in a precursor bubbler at a temperature from about 150-200 degrees Celsius. Carrier gas, such as nitrogen, is directed into the bubbler with a flow rate of about 400 sccm. The hafnium precursor saturates the carrier gas and is pulsed into the chamber for 3 seconds. A purge gas of nitrogen is pulsed into the chamber 100 for 3 seconds to remove any unbound hafnium precursor. Hydrogen gas and oxygen gas with the flow rate of 120 sccm and 60 sccm respectively, are supplied to a water vapor generator (WVG) system. The in-situ steam exits from the WVG with approximately 60 sccm of water vapor. The in-situ steam is pulsed into the chamber for 1.7 seconds. The purge gas of nitrogen is pulsed into the chamber 100 for 4 seconds to remove any unbound or non-reacted reagents, such as byproducts, hafnium precursor, oxygen and/or water or any by-products such as HCl. The temperature of the substrate 112 is maintained at a temperature between about 400-600 degrees Celsius. Illustratively, each ALD cycle may form about 0.8 Angstroms of a hafnium oxide film.

Although the embodiments of the invention are described to deposit hafnium-containing compounds, a variety of metal oxides and/or metal silicates may be formed outside of the hafnium-containing compounds by alternately pulsing metal precursors with oxidizing gas derived from a WVG system, such as a fluid of water vapor and $O_2$. The ALD processes disclosed above may be altered by substituting the hafnium and/or silicon precursors with other metal precursors to form materials, such as hafnium aluminates, titanium silicates, zirconium oxides, zirconium silicates, zirconium aluminates, tantalum oxides, tantalum silicates, titanium oxides, titanium silicates, silicon oxides, aluminum oxides, aluminum silicates, lanthanum oxides, lanthanum silicates, lanthanum aluminates, nitrides thereof, and combinations thereof.

Methods and apparatus for a gas delivery assembly are provided herein. The gas delivery assembly may advantageously provide reduced Joule-Thompson Cooling through gas conduits having a expanding non-circular cross-section, and optionally coupled to external heaters. The orientation of the gas conduits such that the longitudinal axis of each conduit intersects the central axis of the gas inlet funnel may advantageously reduce vortex formation in the gas inlet funnel.

While the foregoing is directed to embodiments of the present invention, other and further embodiments of the invention may be devised without departing from the basic scope thereof, and the scope thereof is determined by the claims that follow. While the foregoing is directed to embodiments of the present invention, other and further embodiments of the invention may be devised without departing from the basic scope thereof, and the scope thereof is determined by the claims that follow.

The invention claimed is:

1. A gas delivery assembly, comprising:
    a gas inlet funnel having a first volume; and
    one or more gas conduits, each gas conduit having an inlet and an outlet for facilitating the flow of a gas therethrough and into the first volume, wherein each gas conduit has a second volume less than the first volume, and wherein each gas conduit has a cross-section that increases from a first cross-section proximate the inlet to a second cross-section proximate the outlet but excluding any intersection points between the gas inlet funnel and the gas conduit, wherein the second cross-section is non-circular.

2. The gas delivery assembly of claim 1, wherein each gas conduit has a longitudinal axis that intersects a central axis of the gas inlet funnel.

3. The gas delivery assembly of claim 2, further comprising:
    at least two gas conduits, wherein the at least two gas conduits have diametrically opposing longitudinal axes that are aligned with each other.

4. The gas delivery assembly of claim 2, wherein the one or more gas conduits comprise:
    at least two gas conduits, wherein the at least two gas conduits have perpendicular longitudinal axes.

5. The gas delivery assembly of claim 2, wherein each gas conduit has a longitudinal axis perpendicular to the central axis of the gas inlet funnel.

6. The gas delivery assembly of claim 2, wherein each gas conduit has a longitudinal axis at an angle to the central axis of the gas inlet funnel.

7. The gas delivery assembly of claim 1, further comprising:
one or more heaters coupled to the one or more gas conduits for heating gases flowing therethrough.

8. The gas delivery assembly of claim 1, wherein the gas inlet funnel has an increasing cross-section along at least a portion of the central axis in the direction of gas flow.

9. The gas delivery assembly of claim 1, wherein the ratio of the cross-sectional area at the outlet to the cross-sectional area at the inlet is about 3:1 or greater.

10. An apparatus for processing a substrate, comprising:
a process chamber having an inner volume; and
a gas delivery assembly coupled to the process chamber for introducing a process gas into the inner volume, wherein the gas delivery assembly comprises:
a gas inlet funnel having a first volume; and
one or more gas conduits, each gas conduit having an inlet and an outlet for facilitating the flow of a gas therethrough and into the first volume, wherein each gas conduit has a second volume less than the first volume, and wherein each gas conduit has a cross-section that increases from a first cross-section proximate the inlet to a second cross-section proximate the outlet but excluding any intersection points between the gas inlet funnel and the gas conduit, wherein the second cross-section is non-circular.

11. The apparatus of claim 10, wherein each gas conduit has a longitudinal axis aligned with a central axis of the gas inlet funnel.

12. The apparatus of claim 11, wherein the one or more gas conduits comprise:
at least two gas conduits, wherein the at least two gas conduits have diametrically opposing longitudinal axes that are aligned with each other.

13. The apparatus of claim 11, further comprising:
at least two gas conduits, wherein the at least two gas conduits have perpendicular longitudinal axes.

14. The apparatus of claim 11, wherein each gas conduit has a longitudinal axis perpendicular to the central axis of the gas inlet funnel.

15. The apparatus of claim 11, wherein each gas conduit has a longitudinal axis at an angle to the central axis of the gas inlet funnel.

16. The apparatus of claim 10, further comprising:
one or more heaters coupled to the one or more gas conduits and facilitating heating of a gas flowing therethrough.

17. The apparatus of claim 10, wherein the gas inlet funnel has an increasing cross-section along at least a portion of the central axis and in the direction of gas flow.

18. The apparatus of claim 10, wherein the ratio of the cross-sectional area at the outlet to the cross-sectional area at the inlet is about 3:1 or greater.

19. The gas delivery assembly of claim 1, wherein the first cross-section proximate the inlet is circular and the second cross-section proximate the outlet is rectangular.

20. The apparatus of claim 10, wherein the first cross-section proximate the inlet is circular and the second cross-section proximate the outlet is rectangular.

* * * * *